United States Patent [19]
Lo

[11] Patent Number: 4,847,136
[45] Date of Patent: Jul. 11, 1989

[54] THERMAL EXPANSION MISMATCH FORGIVABLE PRINTED WIRING BOARD FOR CERAMIC LEADLESS CHIP CARRIER

[75] Inventor: Ching-Ping Lo, Los Angeles, Calif.

[73] Assignee: Hughes Aircraft Company, Los Angeles, Calif.

[21] Appl. No.: 171,047

[22] Filed: Mar. 21, 1988

[51] Int. Cl.[4] ............................................. B32B 9/00
[52] U.S. Cl. .................................... 428/195; 428/332;
428/339; 428/413; 428/414; 428/416;
428/473.5; 428/901; 174/68.5; 361/398;
156/277; 156/289; 156/291; 156/310
[58] Field of Search ............... 174/68.5; 361/398, 400;
428/137, 195, 416, 414, 209, 210, 413, 332, 339,
473.5, 901; 156/277, 289, 291, 310

[56] References Cited

U.S. PATENT DOCUMENTS

| 4,458,294 | 7/1984 | Womack | 361/321 |
| 4,647,508 | 3/1987 | Gazit et al. | 428/421 |
| 4,658,332 | 4/1987 | Baker et al. | 361/398 |
| 4,680,220 | 7/1987 | Johnson | 428/241 |

FOREIGN PATENT DOCUMENTS 2097998 11/1982 United Kingdom .

Primary Examiner—Ellis P. Robinson
Assistant Examiner—P. J. Ryan
Attorney, Agent, or Firm—M. E. Lachman; A. W. Karambelas

[57] ABSTRACT

A modified printed wiring board for reducing the cracking of solder joints used to attach ceramic leadless chip carriers to the surface of the printed wiring board. A relatively thin expansion layer is provided on top of the conventional printed wiring board. This expansion layer is bonded to the printed wiring board except at locations underneath the footprint of the chip carrier and solder joints. This expansion layer reduces the stress of solder joints between the ceramic leadless chip carrier and the printed wiring board due to thermal expansion mismatch, thereby reducing cracking of the solder joint.

13 Claims, 1 Drawing Sheet

THERMAL EXPANSION MISMATCH FORGIVABLE PRINTED WIRING BOARD FOR CERAMIC LEADLESS CHIP CARRIER

BACKGROUND OF THE INVENTION

1. Field of the Invention

The present invention relates generally to the surface mounting of ceramic leadless chip carriers to printed wiring boards. More particularly, the present invention relates to methods and apparatus for increasing the reliability of the solder joint integrity between the printed wiring board and the chip carrier.

2. Description of Related Art

The surface mounting of electronic devices, such as ceramic leadless chip carriers, has become popular due to the ability to save weight and volume in electronic equipment when such surface-mount technology is used. In addition, the need for increased circuit density makes surface mounting of chip carriers even more desirable.

Typically, the ceramic leadless chip carrier is mounted to the printed wiring board surface by way of solder fillets or joints. It is important that the integrity and reliability of the solder joint be maintained for long periods of time and be able to withstand numerous temperature and power cycles. In addition, the solder joint must be able to withstand shock and vibration which may occur in many electronic systems such as those used in avionics.

The increasing popularity of surface mounting of ceramic leadless chip carriers has brought with it concerns over the reliability and integrity of the solder joints between the chip carriers and the printed wiring board. Cracking and other disturbances to the joint integrity have been noted. Joint cracking is believed to be due mainly to differences in the thermal coefficients of expansion between the printed wiring board and the chip carriers. Various different approaches have been taken to reduce the possibility of solder joint cracking. These approaches have included making the printed wiring board out of materials having thermal coefficients of expansion which are close to the thermal coefficient of expansion for the ceramic leadless chip carriers. Although the various approaches used to date have experienced different degrees of success, there still is a continuing need to provide a method for surface mounting ceramic leadless chip carriers to printed wiring boards wherein the possibility of solder joint cracking is eliminated.

SUMMARY OF THE INVENTION

The present invention provides an improved method and apparatus for mounting ceramic leadless chip carriers to printed wiring boards wherein the chances of solder joint cracking are reduced to thereby increase the reliability and integrity of the system.

The present invention is based upon fabricating the printed wiring circuit board so that the top layer of the board expands and contracts with the chip carrier regardless of the expansion or contraction rates of the main body of the wiring board.

The printed wiring board in accordance with the present invention includes an expansion layer having a bottom surface and top surface wherein the top surface of the expansion layer forms the top surface of the printed wiring board. The expansion layer is supported by a rigid support layer which also has a top and a bottom. The bottom of the expansion layer is bonded to the top of the rigid support layer except in the area located directly below the footprint of the chip carrier and solder joints. This lack of bonding between the expansion layer and rigid support layer provides a forgivable expansion area located underneath the chip carrier footprint wherein the expansion layer can expand and contract the same amount (displacement) as the chip carrier irrespective of the expansion and contraction rates of the rigid support layers.

As a feature of the present invention, the expansion layer is relatively thin and flexible, and the leadless chip carrier solder joint stress caused by thermal expansion mismatch between the leadless chip carrier and the expansion layer is extremely low so that the chances for solder joint cracking are reduced.

The above-described and many other features and attendant advantages of the present invention will become better understood by reference to the following description when considered in conjunction with the accompanying drawings.

DESCRIPTION OF THE PREFERRED EMBODIMENTS

Figure 1:
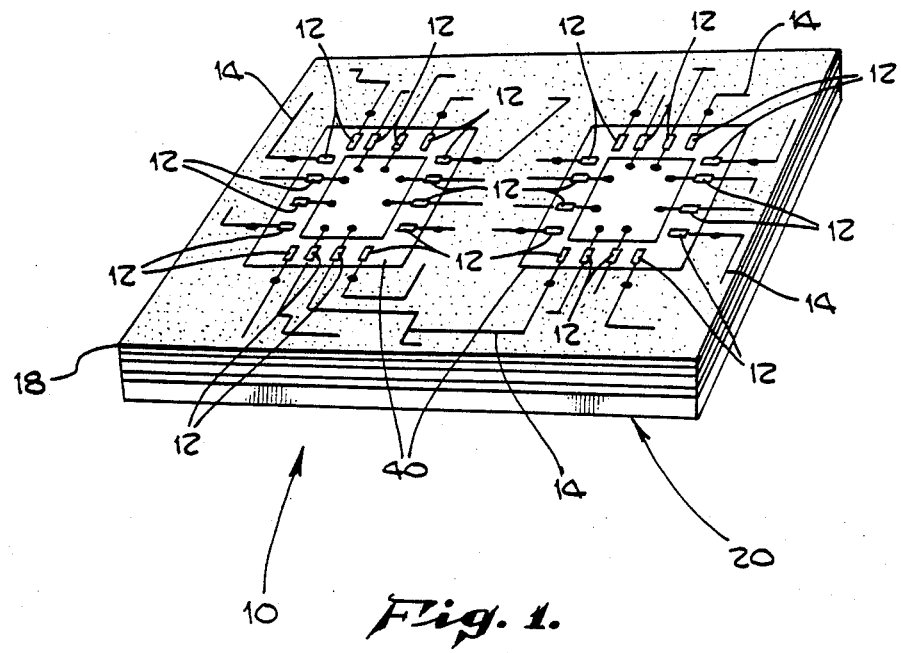
FIG. 1 is a perspective view of a printed wiring board prior to mounting of the ceramic leadless chip carriers.
Figure 2:
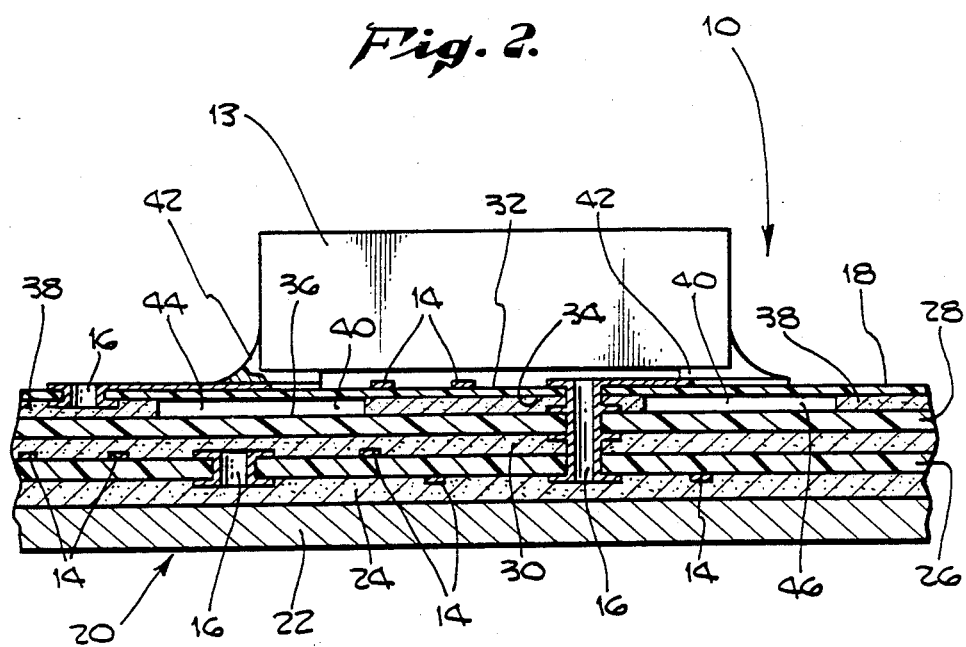
FIG. 2 is a cross-sectional view of the printed wiring board with a leadless ceramic chip carrier soldered thereon.

A preferred printed wiring board in accordance with the present invention is shown generally at 10 in FIGS. 1 and 2. The printed wiring board 10 is shown in FIG. 1 prior to mounting of the ceramic leadless chip carriers. The board 10 includes a plurality of chip carrier mounting pads 12. Circuit lines connecting the various circuitry are shown at 14. Via holes are shown at 16. The circuit lines and via holes are provided for illustration purposes only since these are conventional features of any printed wiring board and do not form a part of the invention. A detailed sectional view of a portion of the printed wiring board 10 is shown in FIG. 2 after the ceramic leadless chip carrier 13 is mounted thereon.

The preferred printed wiring board includes an expansion layer 18 which is bonded to a rigid support layer shown generally at 20. The support layer 20 is a multi-layer laminated board, which as best shown in FIG. 2, includes a metal plate 22, thermally conductive adhesive layer 24, and polyimide impregnated glass fiber layers 26 and 28 (referred to herein as polyimide fiberglass) which are bonded together by adhesive layer 30. The metal plate 22 is optional. As is well known, metal plates are included as part of a printed wiring board where it is desirable to thermally conduct heat away from the printed wiring board and where added strength is desired. If a metal plate 22 is used, it is desirable to use a thermally conductive adhesive 24 in order to ensure that heat from the printed wiring board is conducted to the metal plate 22.

The polyimide fiberglass layers 26 and 28 do not necessarily have to be made of polyimide fiberglass. Other suitable printed wiring board materials, such as epoxy fiberglass, polyimide quartz fibers, alumina (ceramic) fiber substrates, polyimide aramid fibers and any other suitable composite materials typically used in printed wiring boards can also be used as the printed wiring board layers. The adhesive layer 30 which is used to bond the layers 26 and 28 together may also be any of the conventionally known adhesives commonly used in preparing laminated printed wiring boards. Examples of suitable adhesives include epoxy prepreg, polyimide prepreg, etc.

When a metal layer 22 is used, it will preferably have a thickness of between about 0.030 inch (0.076 cm) to 0.300 inch (0.76 cm). The polyimide fiberglass layers 26 and 28 preferably have thicknesses of between about 0.004 inch (0.010 cm) to 0.25 inch (0.64 cm). The thickness of the two adhesive layers 24 and 30 are preferably between about 0.004 inch (0.010 cm) to 0.012 inch (0.030 cm). The particular metal used for the metal layer can be any of those conventionally used in printed wiring boards including aluminum, copper and copper alloys and any other suitable thermally conductive metal.

In conventional printed wiring boards, the ceramic leadless chip carrier would be attached directly to the laminated support layer 20. However, in accordance with the present invention, an expansion layer 18 is provided. The expansion layer 18 includes a top 32 and bottom 34. The bottom 34 of expansion layer 18 is bonded to the top 36 of the support layer 20 by way of adhesive layer 38. As best shown in FIG. 2, the adhesive layer 38 does not cover the entire area underneath the chip carrier 13. This leaves an unbonded area 40 where the expansion layer 18 is not attached to the support layer 20. This provides an expansion area wherein the expansion layer 18 is free to expand and contract with chip carrier 13 irrespective of the remainder of the printed wiring board 20.

The chip carrier 13 is mounted onto the top 32 of expansion layer 18 by way of solder fillets or joints 42. The area under the chip carrier 13 and solder joints 42 is defined as the footprint of the chip carrier. In accordance with the present invention, the adhesive layer 38 provides no bonding at locations beneath the chip carrier footprint. The area of non-bonding will extend slightly outward from the footprint as best shown at 44 and 46 in FIG. 2. This provides a non-bonded portion of the expansion layer 18 which does not lie directly beneath the chip carrier footprint. It is essential that this extra non-bonded portion be provided.

The expansion layer 18 is made from a material having low modulus of elasticity, such as a polyimide film. A preferred polyimide film is marketed by E. I. DuPont under the trade name KAPTON. Other flexible films are possible so long as they have properties similar to polyimide including high temperature stability and good bonding characteristics. These films include polyvinyl plastic films and films made of polytetrafluoroethylene. The films should not contain fillers, such as glass particles or beads which might adversely affect the flexibility of the film.

The thickness of the expansion layer should be such that it has some degree of flexibility while still being structurally strong. Layer thicknesses of between 0.0001 inch (0.0002 cm) to 0.005 inch (0.013 cm) are suitable. Suitable adhesives for attaching the expansion layer 18 to the support layer 20 include no-flow type adhesives such as polyimide prepreg, epoxy prepreg, etc. The thickness of the adhesive layer should be less than about 0.005 inch (0.013 cm).

Polyimide films are preferred for use as the expansion layer because polyimide sheeting can be made in very thin sheets while being structurally strong. Further, the modulus of elasticity for polyimide films are very low ($4.6 \times 10^5$ psi). Accordingly, the stretching or shrinking of the thin expansion layer under the chip carrier will cause very low stress on the solder joints 42. This stress will be substantially below the fatigue stress of the solder joint. Therefore, the solder joint will not develop cracks.

Any suitable fabrication technique can be utilized in order to insure that the expansion layer 18 is not bonded to the top 36 of support layer 20 at locations under the chip carrier footprint. For example, the unbonded footprint area 40 can be achieved by die cutting the prepreg adhesive layer or by applying various mold release agents on the bottom 34 of expansion layer 18 to prevent the adhesive 38 from adhering to the area below the chip carrier. In addition, layers or sheets of conventional release materials may be inserted between the expansion layer bottom 34 and the top 36 of support layer 20.

Tests were conducted on leadless ceramic chip carriers (LCCC) as shown in FIG. 2 wherein the LCCC size was 84 I/O, 50 mil center. The LCCC's included a polyimide glass printed wiring board (PWB) assembly which was 0.09 inch (0.24 cm) thick. The expansion layer was flexible polyimide sheet made by Enka having a thickness of 0.001 inch (0.002 cm). A vibration test was performed. The purpose of this test was to find out whether any damage would occur under vibration in the following areas: the LCCC solder joint, the thin flexible expansion layer in the unbonded area, and the PWB itself. The test results showed that this PWB could take high vibration input without any damage.

Ordinarily, the LCCC solder joints of more rigid PWBs have a better chance for surviving the vibration test because rigid boards have a high resonance frequency. When the PWB is resonant, the solder joints of the LCCC have high stresses. If the natural frequency of the PWB is higher than the electronic system's operating vibration frequency (fans, motors, etc.), the vibration will have a minimum effect on the reliability of the PWBs. When the PWB is resonant, it vibrates in a waveform. This waveform tends to pull the PWB away from the LCCC causing high stress on its solder joint.

The compliant-layer PWB of the present invention does not have very high rigidity if no heat sink is used. However, the compliant-layer PWB functions differently from regular PWBs. The thin, flexible, top layer tolerates displacement mismatch between the LCCC and the PWB because the thin layer can stretch or compress without creating high stress on the solder joint. This provides a solution to the solder joint failure (due to vibration) of the surface mount device.

Power cycling tests were also performed. All of the compliant-layer PWBs were tested at their worst condition. First, the PWBs were cooled down to $-55°$ C. Then, each LCCC was heated up by chip resistors which were bonded on the LCCCs. The 84-I/O LCCCs used three resistors which dissipated 4.5 watts, the 68-I/O LCCCs used two resistors which dissipated 3 watts, and the 48-I/O LCCCs used one resistor which dissipated 1.5 watts. The PWBs were tested for 1,200 cycles, and none of the solder joints was cracked.

In addition, thermal shock tests were performed. The test procedure was as follows. All of the PWBs were placed into a thermal shock machine. These boards were alternately shifted from a hot chamber to a cold chamber and vice versa. The temperature of the hot chamber was +125° C., and the cold chamber was −55° C. The duration of the PWBs stay in each chamber was 20 minutes.

After a 2,000-cycle thermal shock test, there were no solder joint failures. All of the solder joints looked the same as before the test.

To measure the thermal impedance of the PWBs, the chip resistors were bonded on the center cavity of the LCCCs. It had the same arrangement as the one used for power cycling. The thermocouples were mounted in the LCCC cavity on the LCCC wall, and on the PWB. The power consumption of each LCCC and the temperature of each thermocouple were measured. The thermal impedance of the PWB was calculated. The thermal impedance test results showed that the compliant-layer PWB had the same thermal character as the regular polyimide glass PWB.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein, but are only limited by the following claims.

What is claimed is:

1. A printed wiring board for mounting a ceramic leadless chip carrier, said ceramic leadless chip carrier including a bottom which is attached to the top surface of said printed wiring board, wherein the area on the top surface of said printed wiring board under the location where said ceramic leadless chip carrier bottom is attached thereto defines a chip carrier footprint, and wherein said ceramic leadless chip carrier undergoes expansion and contraction, said printed wiring board comprising:
    an expansion layer having a bottom surface and a top surface wherein the top surface of said expansion layer forms the top surface of said printed wiring board, said expansion layer having a low modulus of elasticity and having a thickness in the range of from about 0.0001 to about 0.005 inch;
    a rigid support layer having a bottom and a top surface;
    adhesive means located between said expansion layer bottom surface and said support layer top surface for bonding said expansion layer bottom to said support layer top wherein voids are provided in said adhesive means under said chip carrier footprint so that said expansion layer bottom surface is not bonded to said support layer top surface at said chip carrier footprint to thereby allow said expansion layer to expand and contract with said ceramic leadless chip carrier during expansion or contraction thereof irrespective of said support layer.

2. A printed wiring board according to claim 1 wherein said expansion layer comprises film of polyimide.

3. A printed wiring board according to claim 2 wherein said expansion layer is a flexible polyimide.

4. A printed wiring board according to claim 1 wherein said support layer comprises a plurality of sub-layers laminated together.

5. A printed wiring board according to claim 4 wherein said sub-layers comprise metal, glass, ceramics or rigid plastic.

6. A printed wiring board according to claim 1 wherein said adhesive means comprises an adhesive layer between said expansion layer and said support layer.

7. A printed wiring board according to claim 6 wherein said adhesive layer comprises an adhesive selected from the group consisting of polyimide prepreg and epoxy prepreg.

8. A printed wiring board according to claim 6 wherein said adhesive layer is less than about 0.005 inch (0.013 cm) thick.

9. A printed wiring board according to claim 1 further including a ceramic leadless chip carrier and mounting means for attaching said ceramic leadless chip carrier to the top surface of said expansion layer and wherein expansion and contraction of said expansion layer with the expansion and contraction of said ceramic leadless chip carrier prevents cracking of said mounting means.

10. A method for reducing the cracking of solder joints used to attach ceramic leadless chip carriers to the surface of printed wiring boards wherein the location of said solder joints and ceramic leadless chip carriers on the printed wiring board surface defines a footprint, said method comprising the steps of:
    providing an expansion layer having a top surface and a bottom surface and providing a rigid support layer having a top surface and a bottom surface, said expansion layer having a low modulus of elasticity and having a thickness in the range of from about 0.0001 inch to about 0.005 inch;
    bonding the expansion layer bottom surface to the support layer top surface with an adhesive wherein said expansion layer top surface becomes the printed wiring board surface to which said ceramic leadless chip carriers are attached by means of said solder joints and wherein said expansion layer is not bonded to said support layer underneath said footprint to thereby reduce the cracking of said solder joints.

11. A method according to claim 10 wherein said expansion layer comprises polyimide.

12. A method according to claim 10 wherein said rigid support layer is made by laminating a plurality of sub-layers together.

13. A method according to claim 10 wherein said adhesive is applied to provide an adhesive layer between said expansion layer and said support layer which is less than about 0.005 inch (0.013 cm) thick.

* * * * *